(12) United States Patent
Kim et al.

(10) Patent No.: US 10,336,605 B2
(45) Date of Patent: Jul. 2, 2019

(54) MICRO ELECTRO MECHANICAL SYSTEMS SENSOR

(71) Applicant: SAMSUNG ELECTRO-MECHANICS CO., LTD., Suwon-Si (KR)

(72) Inventors: Jong Woon Kim, Suwon-Si (KR); Chang Hyun Lim, Suwon-Si (KR); Sung Jun Lee, Suwon-Si (KR); Jong Beom Kim, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 581 days.

(21) Appl. No.: 14/549,544

(22) Filed: Nov. 21, 2014

(65) Prior Publication Data

US 2015/0135834 A1 May 21, 2015

(30) Foreign Application Priority Data

Nov. 21, 2013 (KR) .................. 10-2013-0142386
May 29, 2014 (KR) .................. 10-2014-0065314

(51) Int. Cl.
| | |
|---|---|
| *B81B 3/00* | (2006.01) |
| *G01P 15/08* | (2006.01) |
| *G01P 15/09* | (2006.01) |
| *G01P 15/12* | (2006.01) |
| *G01P 15/18* | (2013.01) |
| *G01C 19/5705* | (2012.01) |

(52) U.S. Cl.
CPC ............ *B81B 3/0072* (2013.01); *G01P 15/09* (2013.01); *G01P 15/123* (2013.01); *G01P 15/18* (2013.01); *B81B 2201/0235* (2013.01); *G01C 19/5705* (2013.01); *G01P 2015/0842* (2013.01)

(58) Field of Classification Search
CPC ........... B81B 3/0072; B81B 2201/0235; G01P 15/123; G01P 15/09; G01P 15/18; G01P 2015/0842; G01C 19/5705
See application file for complete search history.

(56) References Cited

U.S. PATENT DOCUMENTS

| | | | |
|---|---|---|---|
| 6,448,624 B1 | 9/2002 | Ishio et al. | |
| 8,477,473 B1* | 7/2013 | Koury, Jr. ............. | G01P 15/125 361/280 |
| 2012/0152020 A1* | 6/2012 | Kim ....................... | G01P 15/09 73/514.32 |

(Continued)

FOREIGN PATENT DOCUMENTS

KR    10-2006-0126741    12/2006

OTHER PUBLICATIONS

Office action dated Feb. 27, 2015 from corresponding KR Patent Application No. 10-2014-0065314 and its English translation provided by the applicants.

*Primary Examiner* — Justin Seo
*Assistant Examiner* — John M Royston
(74) *Attorney, Agent, or Firm* — NSIP Law

(57) ABSTRACT

There is provided a MEMS sensor including: a mass body; a support part floatably supporting the mass body; and a flexible beam having one end connected to the mass body and the other end connected to the support part. At least one end of the flexible beam connected to the mass body or the support part includes a curved portion to maximize an effective length supporting a load.

44 Claims, 22 Drawing Sheets

(56) References Cited

U.S. PATENT DOCUMENTS

2012/0205752 A1\* 8/2012 Blackmer ........... B81C 1/00698
                                                   257/415
2014/0084396 A1\* 3/2014 Jenkins ................ B81B 3/0021
                                                   257/419

\* cited by examiner

MICRO ELECTRO MECHANICAL SYSTEMS SENSOR

CROSS-REFERENCE TO RELATED APPLICATION

This application claims the benefit of Korean Patent Application No. 10-2013-0142386, filed on Nov. 21, 2013, entitled "Micro Electro Mechanical System Sensor" and Korean Patent Application No. 10-2014-0065314, filed on May 29, 2014, entitled "Micro Electro Mechanical System Sensor", which are hereby incorporated by reference in their entireties into this application.

BACKGROUND

The present disclosure generally relates to a Micro Electro Mechanical Systems (MEMS) sensor.

Generally, a MEMS sensor has been variously used in a car, aircraft, mobile communication terminals, toys, and the like and is implemented as 3-axis acceleration and angular velocity sensors which measure X-axis, Y-axis and Z-axis accelerations and angular velocities, a pressure sensor, and the like. The MEMS sensor has been developed to have high performance and be miniaturized to detect fine acceleration.

Among the MEMS sensors, the acceleration sensor may have technical features which convert motions of a mass body and a flexible beam into electrical signals. As a type of the acceleration sensor, there are, for example, a piezoresistive type which detects the motion of the mass body from a change in resistance of a piezoresistance element disposed in the flexible beam, a capacitive type which detects the motion of the mass body from a change in capacitance with a fixed electrode, and the like.

Further, the acceleration sensor in which the mass body is connected to a fixed part through a flexible part may detect a displacement of the mass body or a deformation of the flexible part which occurs by an inertial force applied to the mass body in proportion to the applied acceleration. When acceleration larger than a range of the acceleration to be detected is applied by a mechanical impact such as dropping, an excessive stress is applied to the flexible part, such that the flexible part may be broken. Further, to increase sensitivity, the flexible part may be thinly formed. As a result, the flexible part may be easily damaged.

In the MEMS sensor, the rigidity of the flexible part is reinforced by forming, for instance, a fillet or a chamfer at the end of the flexible part connected to the mass body in a thickness direction, but a fine control is needed to form the fillet or the chamfer and therefore productivity may be reduced.

Further, as another method, there is a method of expanding a width of an end of a flexible part to reduce an impact damage stress. In this case, sensitivity may be decreased and there may be a difficulty in an optimal design and a stress dispersion.

RELATED ART DOCUMENT

U.S. Pat. No. 6,448,624

SUMMARY

An aspect of the present disclosure may provide a MEMS sensor capable of maximizing an effective length supporting a load at a connection part of a flexible beam coupled with a mass body part and a support part to disperse a stress concentration without a loss of sensing sensitivity and to reduce a damage inducing stress, thereby securing sensing reliability.

According to an aspect of the present disclosure, a MEMS sensor may include: a mass body; a support part floatably supporting the mass body; and a flexible beam having one end connected to the mass body and the other end connected to the support part. At least one end of the flexible beam connected to the mass body or the support part may include a curved portion to maximize an effective length supporting a load.

According to another aspect of the present disclosure, a MEMS sensor may include: a mass body; a support part floatably supporting the mass body; and a flexible beam having one end connected to the mass body and the other end connected to the support part. At least one end of the flexible beam connected to the mass body or the support part may be provided with an extending part which protrudes in an opposite direction to the connection direction to the mass body or the support part.

According to another aspect of the present disclosure, a MEMS sensor may include: a mass body; a support part floatably supporting the mass body; and a flexible beam having one end connected to the mass body and the other end connected to the support part. At least one end of the flexible beam connected to the mass body or the support part may be provided with a curved portion so that a length of a surface at which the flexible beam contacts the mass body or the support part is increased and a stress at the end at which the flexible beam contacts the mass body or the support part is identically or similarly distributed.

According to another aspect of the present disclosure, a MEMS sensor may include: a mass body; a support part floatably supporting the mass body; and a flexible beam having one end connected to the mass body and the other end connected to the support part, wherein at least one end of the flexible beam is connected to the mass body or the support part so as to be inserted thereinto and is provided with an extending part configured to increase a contact area with the mass body or the support part.

BRIEF DESCRIPTION OF DRAWINGS

The above and other aspects, features and other advantages of the present disclosure will be more clearly understood from the following detailed description taken in conjunction with the accompanying drawings, in which:

FIGS. 1A and 1B are schematic configuration diagrams for describing a basic concept of an exemplary embodiment of the present disclosure, in which FIG. 1A illustrates a flexible beam for a MEMS sensor according to the related art and FIG. 1B illustrates a flexible beam for a MEMS sensor according to an exemplary embodiment of the present disclosure;

DETAILED DESCRIPTION

Figure 1A:
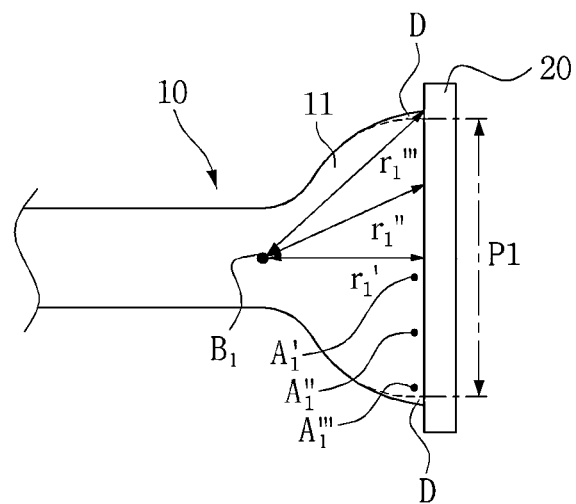

The objects, features and advantages of the present disclosure will be more clearly understood from the following detailed description of the exemplary embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present disclosure, when it is determined that the detailed description of the related art would obscure the gist of the present disclosure, the description thereof will be omitted.

Hereinafter, exemplary embodiments of the present disclosure will be described in detail with reference to the accompanying drawings.

Figure 1B:
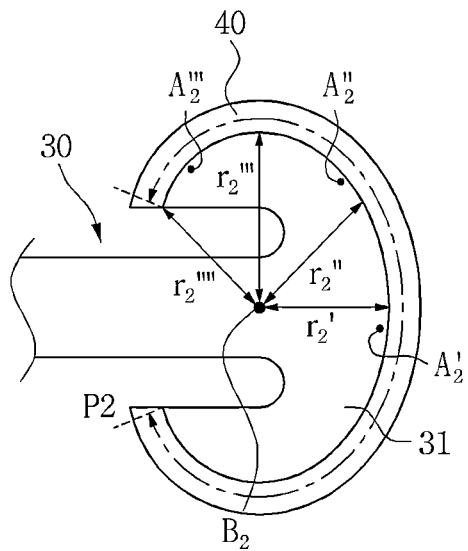

FIGS. 1A and 1B are schematic configuration diagrams for describing a basic concept of an exemplary embodiment of the present disclosure. FIG. 1A illustrates a flexible beam for a MEMS sensor according to the related art, and FIG. 1B illustrates a flexible beam for a MEMS sensor according to an exemplary embodiment of the present disclosure.

As illustrated in FIG. 1A, a flexible beam 10 according to the related art is connected to a support part or a mass body 20 and an end of the flexible beam 10 connected to the support part or the mass body 20 is provided with a connection part 11.

Further, the connection part 11 is formed as an extending part having an wider width than a width of the flexible beam 10 to mitigate a stress concentration occurring at a coupling part of the flexible beam 10 with the support part or the mass body 20.

However, as the width of the flexible beam 10 is gradually increased at an end thereof and an end of the connection part is formed in a straight line, the connection part 11 has a limitation to mitigate the stress concentration.

That is, r1', r1", and r1'" which are distances from a width gradient B1 of the flexible part to the end of the connection part 11 are increasingly increased and when the r1'" is formed to be larger than the r1' at a predetermined size or more, a dead zone D which does not substantially perform a role of supporting a load any more may be formed and an effective length supporting the load may be limited to P1.

Further, as a damage inducing stress which may confirm a dispersion of the stress concentration of the flexible beam 10 according to the related art is gradually reduced toward A1', A1", and A1'" which are ends of the connection part, the damage inducing stress is uniformly formed at the end of the connection part and thus it may be confirmed that the flexible beam 10 may not be implemented in a stable structure.

A flexible beam 30 for a MEMS sensor according to the exemplary embodiment of the present disclosure illustrated in FIG. 1B may be provided with an extending part protruding in an opposite direction to a direction in which the connection part 31 is connected to a support part or a mass body 40.

The reason is that a distance from a width gradient B2 of the flexible part to the end of the connection part 31 is maintained at a predetermined distance while the effective length is maximized to maximally disperse the stress concentration, thereby minimizing the damage inducing stress and uniformly distributing the stress.

In more detail, as a difference in lengths of r2', r2'', r2''', and r2'''' which are distances from the width gradient B2 of the flexible part to the end of the connection part 31 is not large in the connection part 31 and is formed at a predetermined distance or less (smaller than r1), the effective length supporting the load is set to be P2.

Further, as the damage inducing stress which may confirm the dispersion of the stress concentration of the flexible beam 30 is similarly formed at A2', A2'', and A2'''' which are the ends of the connection part 31, it may be confirmed that the flexible beam 30 is implemented in a stable structure.

Further, comparing with the flexible beam 10, as the connection part 31 of the flexible beam 30 is formed in, for examples, but not limited to, a circle, an oval, and the like to have a curve, the distance from the width gradient of the flexible part may be maintained within a predetermined distance and at the same time, a contact area with the mass body or the support part 40 may be maximized.

Consequently, comparing with the flexible beam 10, the flexible beam 30 for a MEMS sensor according to the exemplary embodiment of the present disclosure may reduce damage inducing stress as an effective width supporting a load is maximized and is implemented in a stable structure as a stress is similarly distributed at a beam end.

Figure 2:
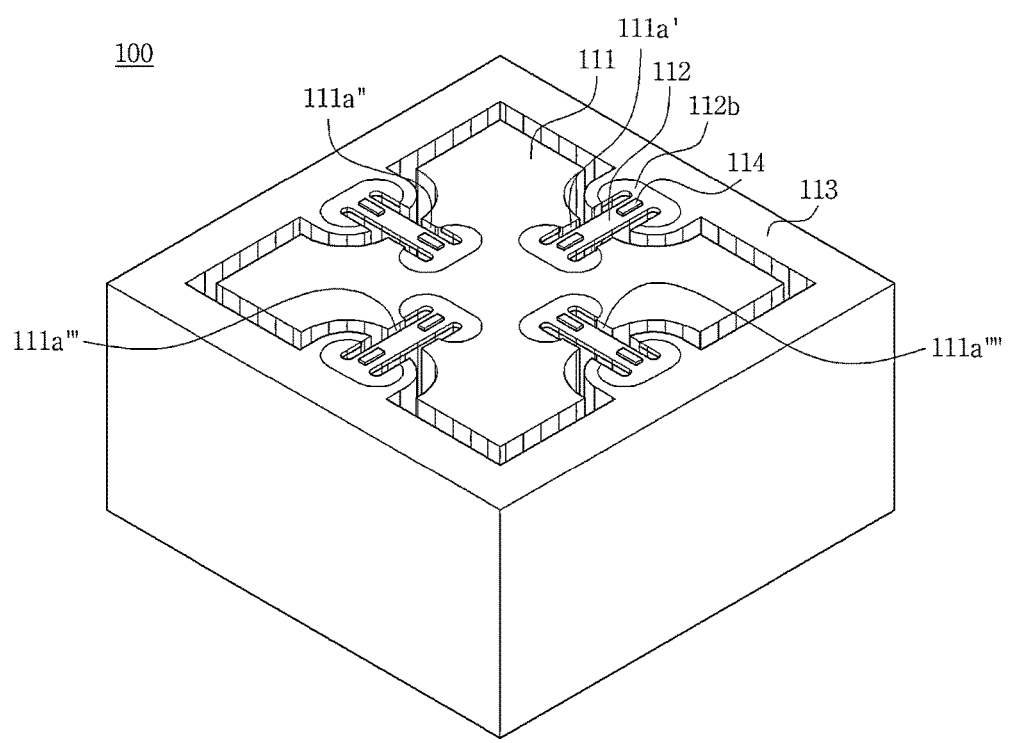
FIG. 2 is a plan perspective view schematically illustrating a MEMS sensor according to a first exemplary embodiment of the present disclosure.
Figure 3:
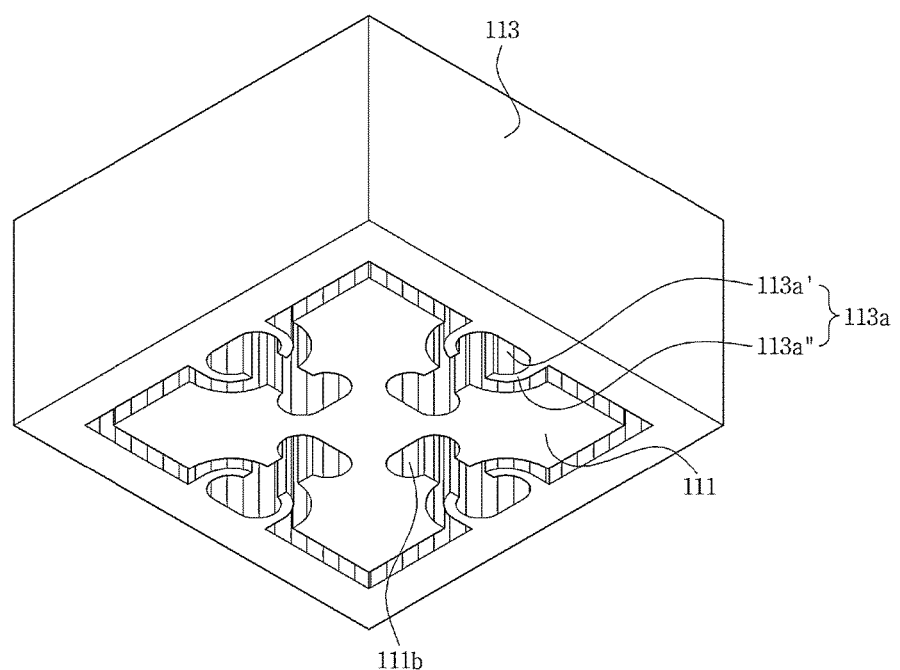
FIG. 3 is a bottom perspective view schematically illustrating the MEMS sensor according to the first exemplary embodiment of the present disclosure.

FIG. 2 is a plan perspective view schematically illustrating a MEMS sensor according to a first exemplary embodiment of the present disclosure, and FIG. 3 is a bottom perspective view schematically illustrating the MEMS sensor according to the first exemplary embodiment of the present disclosure.

As illustrated, a MEMS sensor 100 may include a mass body 111, a flexible beam 112, and a support part 113. Further, an example in which the MEMS sensor 100 is implemented as an acceleration sensor including a sensing means or unit 114 for detecting a physical quantity depending on a displacement of the mass body 111 is illustrated.

However, a MEMS sensor according to another exemplary embodiment of the present disclosure may be variously implemented as a pressure sensor, an angular velocity sensor including a driving means, and the like.

Further, the flexible beam 112 may be provided with the sensing unit 114 detecting a physical quantity depending on the displacement of the mass body 111 and at least one end of the flexible beam 112 connected to the mass body 111. The support part 113 is provided with a curved portion to which another end of the flexible beam 112 is coupled so that the effective length supporting the load may be maximized.

Further, the flexible beam 112 may be provided with an extending part protruding in the opposite direction to the direction connected to the mass body 111 or the support part 113 to maximize the effective length supporting the load.

Further, to implement in more detail the extending part, the flexible beam 112 may be provided with the connection part which is connected to the mass body or the support part, in which the connection part may include a central portion, side portions, and a reinforcing part.

Therefore, the MEMS sensor 100 according to the first exemplary embodiment of the present disclosure may reduce stress concentration to prevent damage and keep sensitivity to secure reliability.

Detailed exemplary embodiments of technical components, coupling therebetween, and acting effect thereof will be described in more detail.

Figure 4:
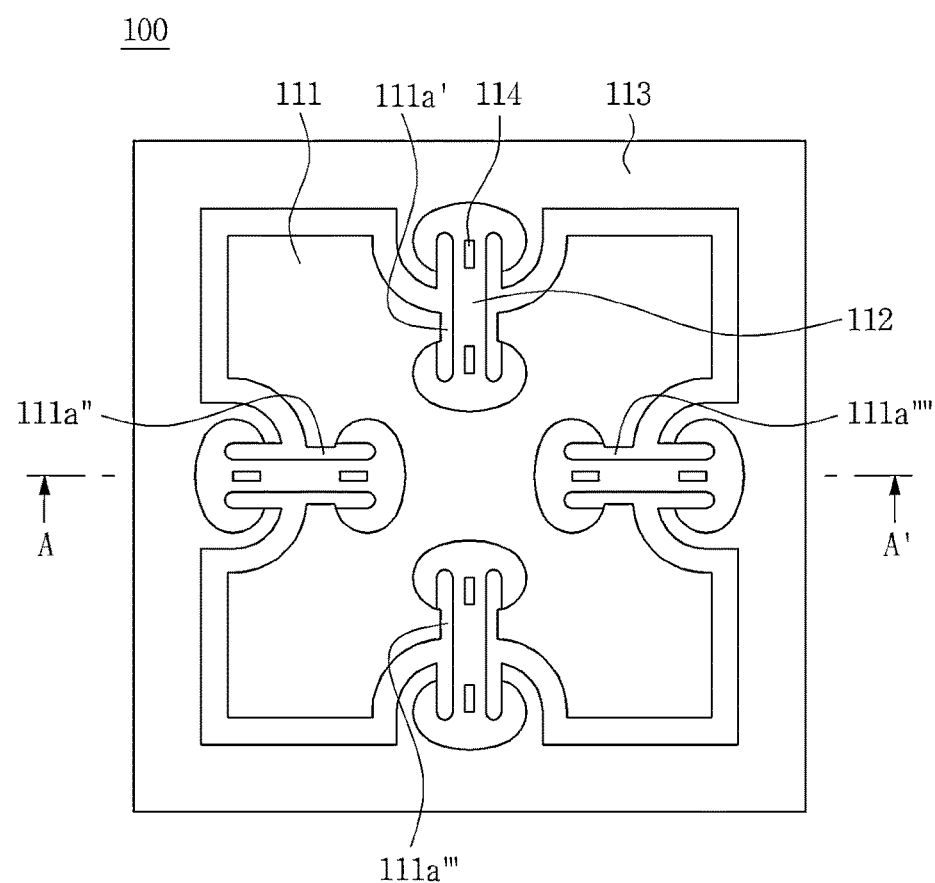
FIG. 4 is a plan view schematically illustrating the MEMS sensor according to the first exemplary embodiment of the present disclosure.
Figure 5:
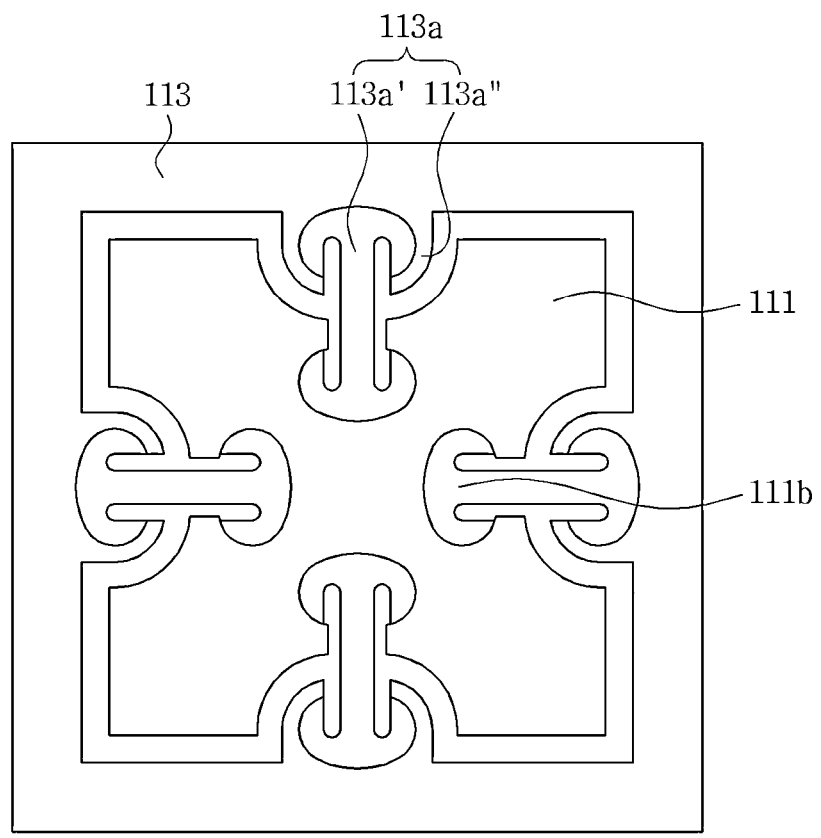
FIG. 5 is a bottom view schematically illustrating the MEMS sensor according to the first exemplary embodiment of the present disclosure.
Figure 6:
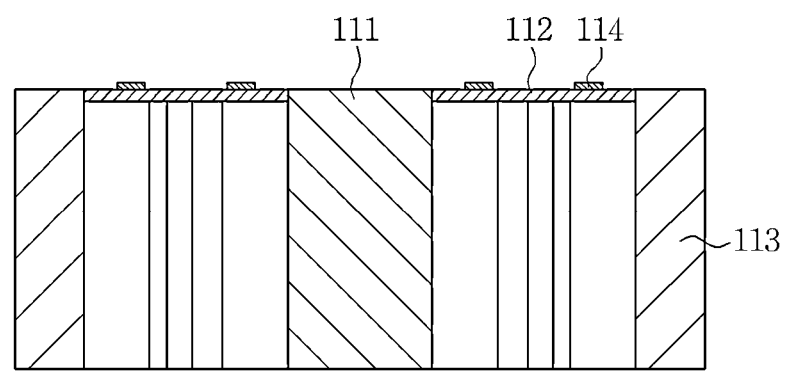
FIG. 6 is a schematic cross-sectional view taken along the line A-A' of the MEMS sensor illustrated in FIG. 4.

FIG. 4 is a plan view schematically illustrating the MEMS sensor according to the first exemplary embodiment of the present disclosure, FIG. 5 is a bottom view schematically illustrating the MEMS sensor according to the first exemplary embodiment of the present disclosure, and FIG. 6 is a schematic cross-sectional view taken along the line A-A' of the MEMS sensor illustrated in FIG. 4.

The mass body 111 may be displaceably or movably coupled with the flexible beam 112 and may be displaced by an inertial force, an external force, a Coriolis force, a driving force and the like.

Further, the mass body 111 is illustrated as being formed in a square pillar shape but is not limited thereto and therefore may be formed in all the shapes known in the art, such as a cylinder.

Further, as illustrated in FIG. 2, the mass body 111 may be provided with four groove parts 111a', 111a'', 111a''', and 111a'''' at equidistance so that the flexible beams 112 may each be connected to the mass body 111 in one or more or all directions and may be generally formed in a rectangular parallelepiped shape.

That is, in order for the central portion of the mass body 111 to be displaceably fixed by the flexible beam 112, the four groove parts 111a', 111a'', 111a''', and 111a'''' are formed to extend from an outer side of the mass body 111 toward the central portion thereof. Each side of the central portion of the mass body 111 is coupled with each of the four flexible beams 112 in at least one or more all directions.

Further, the mass body 111 is provided with a connection part 111b corresponding to a connection part 112b of the flexible beam 112 to be described below. Further, as illustrated in FIG. 3, the connection part 111b of the mass body 111 may be formed as a penetration part having the same shape as or a similar shape with the connection part 112b of the flexible beam 112.

Figure 7:
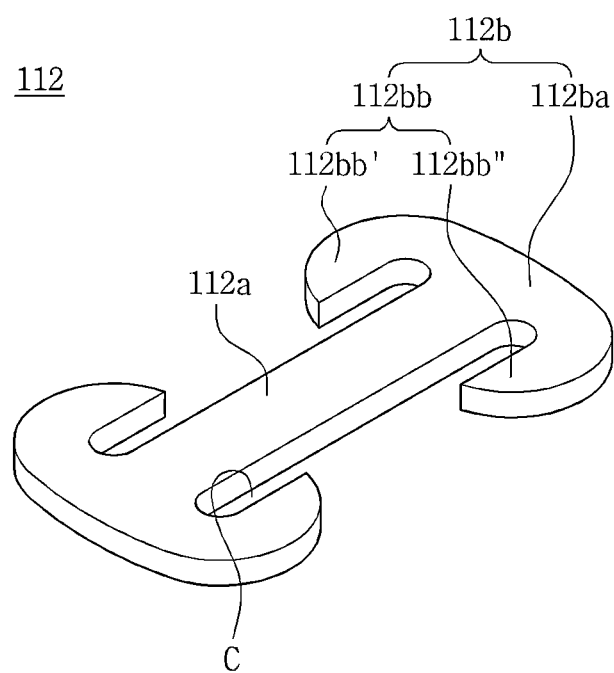
FIG. 7 is a perspective view schematically illustrating a flexible beam according to the first exemplary embodiment of the present disclosure.
Figure 8:
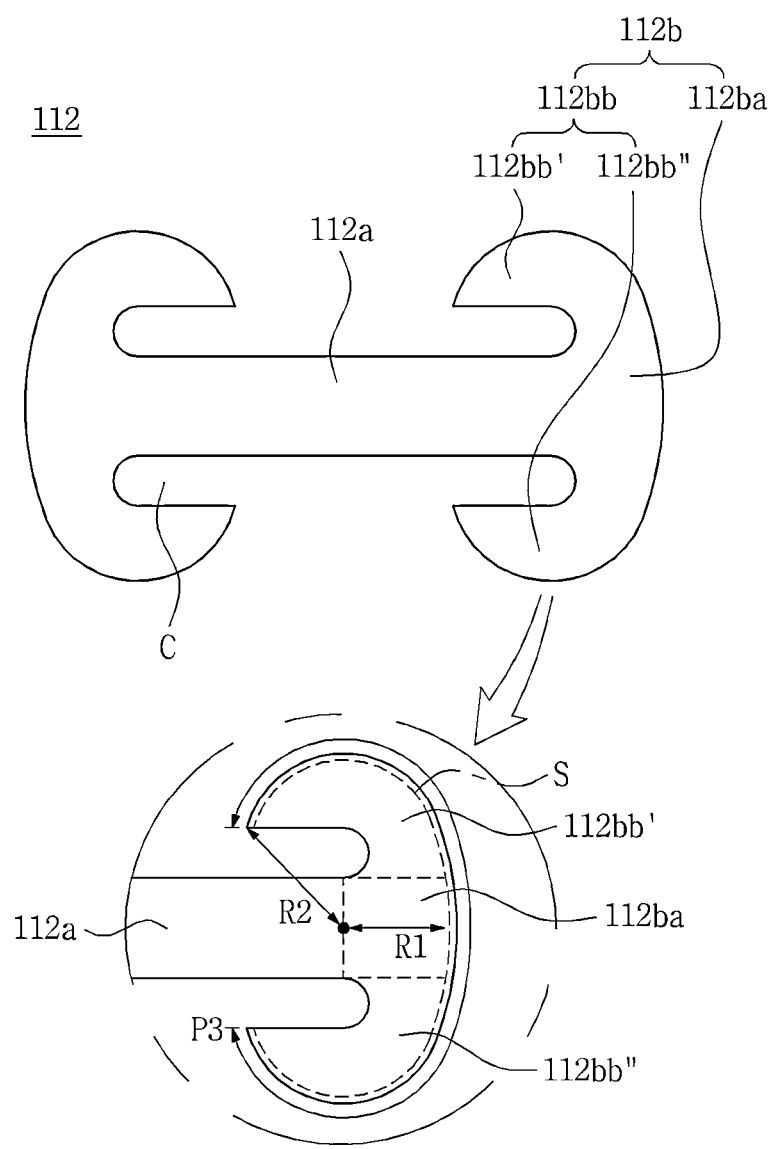
FIG. 8 is a plan view schematically illustrating the flexible beam according to the first exemplary embodiment of the present disclosure.

FIG. 7 is a perspective view schematically illustrating a flexible beam according to the first preferred embodiment of the present disclosure and FIG. 8 is a plan view schematically illustrating the flexible beam according to the first exemplary embodiment of the present disclosure.

As illustrated, the flexible beam 112 may be formed in a plate shape and may be configured of a flexible substrate, such as a membrane and a beam which has elasticity to allow the mass body 111 to be displaced.

Further, as described above, the end of the flexible beam 112 includes a curved portion so that the effective length supporting the load is maximized. Further, the flexible beam 112 is configured of, or comprises, the beam part 112a and the connection part 112b. Further, the connection parts 112b may be formed at both ends of the beam part 112a to be symmetrical with each other and are each connected to the mass body 111 or the support part 113.

Further, the connection part 112b may include a central portion 112ba and a side portion 112bb. For instance, as illustrated in an enlarged view of FIG. 8, the central portion 112ba is formed to extend from the beam part 112a, and the side portion 112bb is configured of a first side portion 112bb' and a second side portion 112bb'' which are formed at both sides based on the central portion 112ba.

Further, the first side portion 112bb' and the second side portion 112bb'' may be formed at both sides based on the central portion 112ba to be symmetrical with each other.

Further, the enlarged view of FIG. 8 illustrates a boundary line of the beam part 112a, the central portion 112ba, the first side portion 112bb' and the second side portion 112bb'' by dotted lines for illustration purposes only.

Further, the first side portion 112bb' and the second side portion 112bb'' may be formed to extend in the opposite direction to the direction connected to the mass body 111 or the support part 113 in the state in which the first side portion 112*bb*' and the second side portion 112*bb*" are each connected to both sides of the central portion 112*ba*.

Further, the first side portion 112*bb*' and the second side portion 112*bb*" may extend to be spaced apart from the beam part 112*a*. Further, the first side portion 112*bb*' and the second side portion 112*bb*" may extend to be parallel with the beam part 112*a*.

That is, the connection part 112*b* extends in the state in which the side portion 112*bb* is spaced apart from the beam part 112*a* with a curved portion C. Further, the connection part 112*b* may extend toward the beam part 112*a* to be parallel with the beam part 112*a*.

Additionally, an outside of the side portion 112*bb* of the connection part 112*b* is formed in a curve, and the connection part 112*b* has a circular beam end shape and may be generally formed in a circle or an oval in which one side of the connection part 112*b* connected to the beam part 112*a* is opened. When only the width length of the connection part extends, the damage inducing stress may not be reduced at a position spaced apart from the width gradient of the flexible part.

Further, the side portion 112*bb* may be implemented to be formed one side of the central portion 112*ba*. That is, the side portion 112*bb* may be not formed as a first side portion and a second side portion but may be formed of only one side portion.

The connection part 112*b* of one side of the flexible beam 112 configured as described above is connected to the central portion of the mass body 111 through the groove parts 111*a*', 111*a*", 111*a*''', and 111*a*"" of the mass body 111 and the connection part 112*b* of the other side thereof is connected to the support part 113.

Further, as described above, one surface of the flexible beam 112 may be provided with the sensing unit 114 (See FIG. 2) detecting the displacement of the mass body 111 and the sensing unit 114 may be variously configured of, for example, but not limited to, a piezoelectric material, a piezoresistive material and the like.

The sensing unit 114 may be disposed at a place at which the flexible beam 112 is maximally deformed.

By the above configuration, as illustrated in the enlarged view of FIG. 8, in the flexible beam 112, an effective width P3 supporting the load may be maximized. Further, it is confirmed from a simulation result that a damage inducing stress K1 of the connection part according to the related art is 0.549 and the damage inducing stress K1 of the connection part 112*b* of the flexible beam 112 is 0.136 which is about 34% of the related art.

Consequently, as the stress concentration of the connection part 112*b* may be dispersed to the side portion 112*bb*, the damage inducing stress is reduced.

That is, as discontinuity of a shape is determined, the stress concentration of the flexible beam 112 minimizes continuity by the curved side portion to maximize the effective width and as the side portion is formed to be parallel with the beam part and extend toward the beam part, the side portion maintains a distance from the gradient position of the flexible part to distribute the uniform stress.

Next, as illustrated in FIGS. 2 and 3, the support part 113 is coupled with the flexible beam 112 which is coupled with the mass body 111 so as to floatably support the mass body 111. The support part 113 may be formed in a hollow shape to displace the mass body 111, thereby securing a space in which the mass body 111 may be displaced.

Further, as illustrated in FIG. 5, the support part 113 is provided with a connection part 113*a* corresponding to the connection part 112*b* of the flexible beam 112. Further, the connection part 113*a* may be provided with a penetration part 113*a*' having the same shape as the connection part 112*b* of the flexible beam 112 illustrated in FIG. 2 and may be provided with a support end 113*a*" covering the connection part 112*b* of the flexible beam 112 which is inserted into the penetration part 113*a*'.

Figure 9:
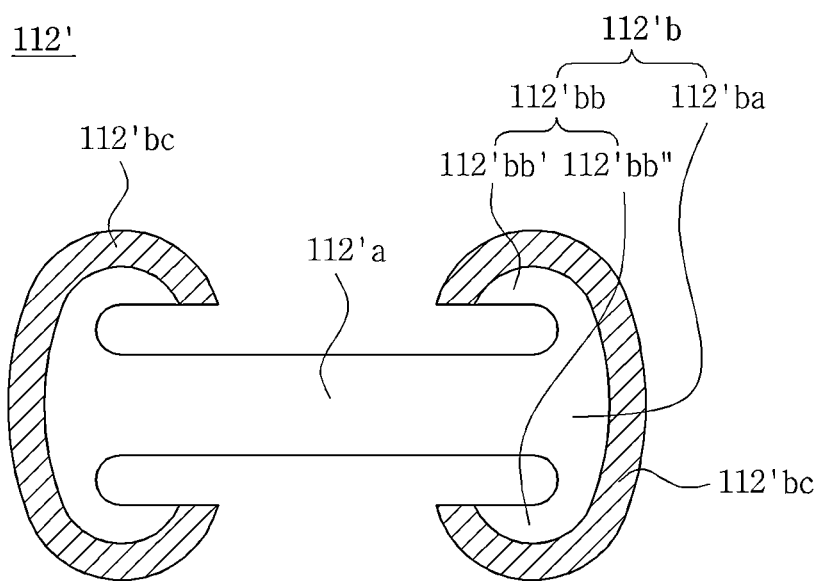
FIG. 9 is a bottom view schematically illustrating a flexible beam according to a second exemplary embodiment of the present disclosure.
Figure 10:
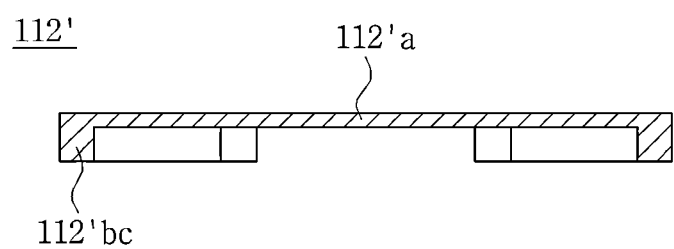
FIG. 10 is a cross-sectional view schematically illustrating the flexible beam according to the second exemplary embodiment of the present disclosure.

FIG. 9 is a bottom view schematically illustrating a flexible beam according to the second exemplary embodiment of the present disclosure and FIG. 10 is a cross-sectional view schematically illustrating the flexible beam according to the second exemplary embodiment of the present disclosure. Further, comparing with the flexible beam 112 according to the first exemplary embodiment of the present disclosure illustrated in FIG. 8, the flexible beam 112' according to the second exemplary embodiment of the present disclosure may further include a reinforcing part 112'*bc*.

The flexible beam 112' may configured of or comprise a beam part 112'*a* and a connection part 112'*b*. Further, the connection parts 112'*b* may be formed at both ends of the beam part 112'*a* to be symmetrical with each other.

Further, the connection part 112'*b* includes a central portion 112'*ba*, a side portion 112'*bb*, and a reinforcing part 112'*bc*. The central portion 112'*ba* may be formed to extend from the beam part 112'*a*. The side portion 112'*bb* may be configured of a first side portion 112'*bb*' and a second side portion 112'*bb*" which are formed at both sides based on the central portion 112'*ba*.

Further, the first side portion 112'*bb*' and the second side portion 112'*bb*" may be formed at both sides to be symmetrical with each other based on the central portion 112'*ba*.

Further, the reinforcing part 112'*bc* is formed to extend from the end of the connection part 112'*b*. That is, the reinforcing part 112'*bc* is formed at the beam end at which the connection part 112'*b* is connected to the mass body 111 or the support part 113 to protrude in a thickness direction which is a direction orthogonal to a direction in which the flexible beam 112' is connected to the mass body 111 or the support part 113.

Figure 11:
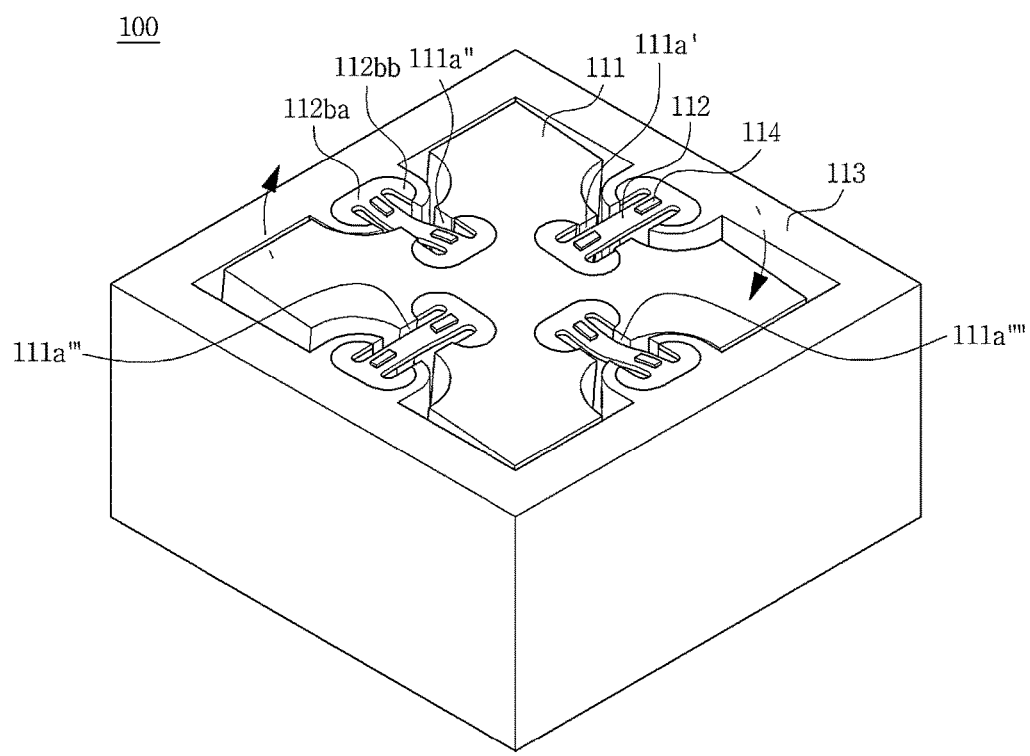
FIG. 11 is a schematic use state diagram of the MEMS sensor according to the first exemplary embodiment of the present disclosure.

FIG. 11 is a schematic use state diagram of the MEMS sensor according to the first exemplary embodiment of the present disclosure. When the mass body 111 of the MEMS sensor 100 is displaced, the flexible beam 112 connected thereto may be deformed with the displacement.

For instance, when the mass body 111 is displaced as illustrated by an arrow based on one axis, the flexible beam 112 may be deformed and the end of the connection part of the flexible beam 112 is connected to the mass body 111 or the support part 113 and thus a stress may be distributed at the connection part 112*b*. In this case, the stress concentration is dispersed at the central portion 112*ba* and the side portion 112*bb* of the connection part 112*b* and thus the damage inducing stress is reduced.

Consequently, the MEMS sensor 100 according to the exemplary embodiment of the present disclosure may secure the sensing reliability by dispersing the stress concentration to remarkably reduce the damage inducing stress and may not need to include the separate reinforcing part and therefore may be simply manufactured by deforming only a mask pattern for etching without reducing the sensitivity due to the deformation of the flexible beam, thereby improving the productivity.

Figure 12:
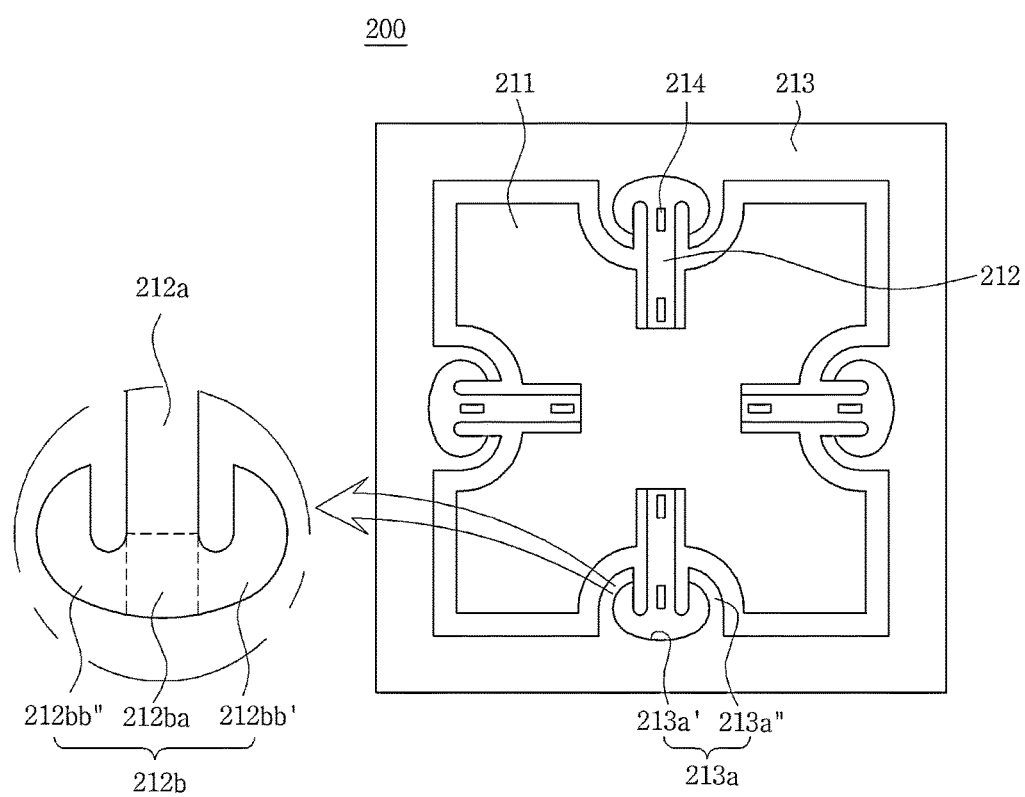
FIG. 12 is a plan view schematically illustrating the MEMS sensor according to the second exemplary embodiment of the present disclosure.

FIG. 12 is a plan view schematically illustrating the MEMS sensor according to the second exemplary embodiment of the present disclosure. A MEMS sensor 200 illustrated in FIG. 12 is different in the formation position of the connection part of the flexible beam, as compared with the MEMS sensor 100 according to the first exemplary embodiment illustrated in FIG. 3. For instance, the connection part 212b of the flexible beam 212 is formed to be connected to the support part 213.

In more detail, the MEMS sensor 200 may include a mass body 211, a flexible beam 212, and a support part 213. Further, an example in which the MEMS sensor 200 is implemented as an acceleration sensor including a sensing means or unit 214 for detecting a physical quantity depending on a displacement of the mass body 211 is illustrated.

Further, the flexible beam 212 may be provided with the sensing unit 214 detecting a physical quantity depending on the displacement of the mass body 211.

Additionally, the flexible beam 212 is configured of a beam part 212a and a connection part 212b. Further, the connection part 212b is formed at one end of the beam part 212a and is connected to the support part 213.

Further, the connection part 212b may include a central portion 212ba and side portions 212bb' and 212bb".

In addition, the connection part 212b may be configured to further include the reinforcing part 112'bc which is formed at the connection part of the flexible beam 112' according to the second exemplary embodiment of the present disclosure (See FIGS. 9 and 10).

Further, the central portion 212ba is formed to extend from the beam part 212a and the side portions 212bb' and 212bb" are configured of a first side portion 212bb' and a second side portion 212bb" which are formed at both sides based on the central portion 212ba.

Additionally, the first side portion 212bb' and the second side portion 212bb" may be formed to be symmetrical with each other.

Next, the support part 213 may be provided with the connection part 213a corresponding to the connection part 212b of the flexible beam 212. Further, the connection part 213a may be provided with a penetration part 213a' having the same shape as the connection part 212b of the flexible beam 212. Additionally, the connection part 213a may be provided with a support end 213a" covering the connection part 212b of the flexible beam 212 which is inserted into the penetration part 213a' of the support part 213.

Further, detailed technical components and coupling therebetween of the MEMS sensor 200 according to the second exemplary embodiment of the present disclosure are the same as, or similar with, the MEMS sensor 100 according to the first exemplary embodiment of the present disclosure and therefore the description thereof will be omitted.

Figure 13:
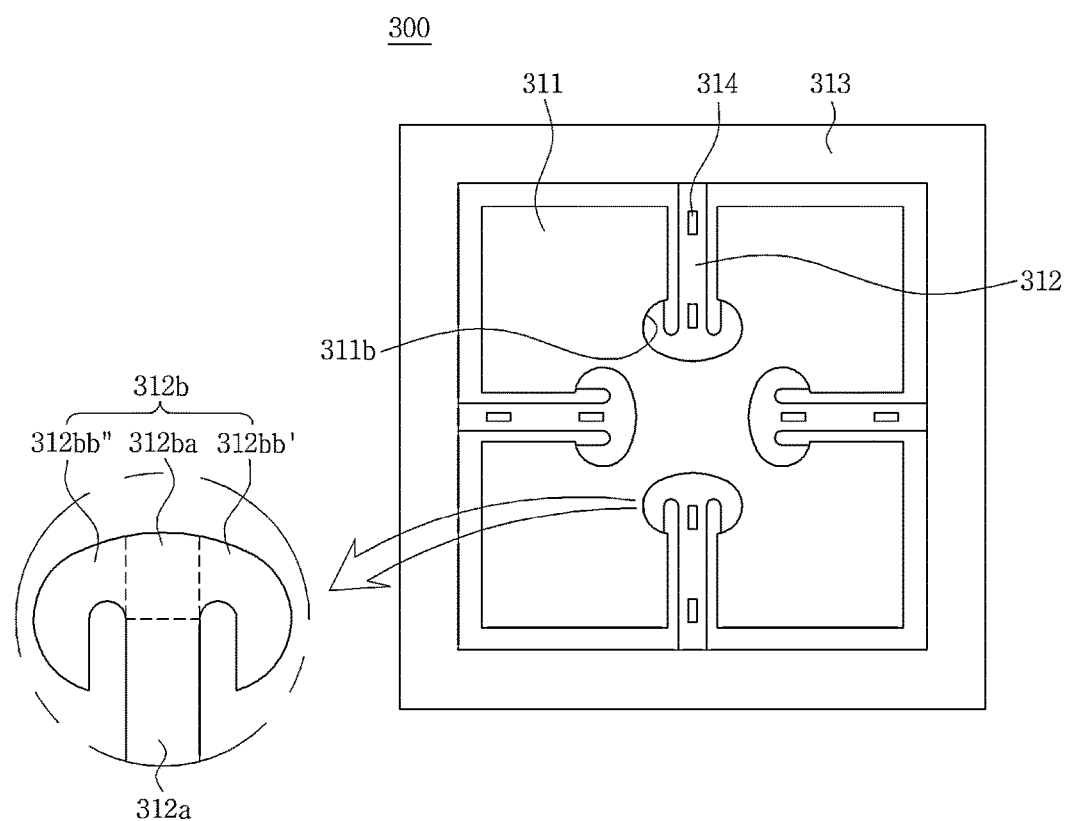
FIG. 13 is a plan view schematically illustrating a MEMS sensor according to a third exemplary embodiment of the present disclosure.

FIG. 13 is a plan view schematically illustrating a MEMS sensor according to a third exemplary embodiment of the present disclosure. A MEMS sensor 300 shown if FIG. 13 is different in the formation position of the connection of the flexible beam, as compared with the MEMS sensor 100 according to the first exemplary embodiment illustrated in FIG. 4. For instance, the connection part 312b of the flexible beam 312 is formed to be connected to the mass body 311.

In more detail, the MEMS sensor 300 may include a mass body 311, a flexible beam 312, and a support part 313. Further, an example in which the MEMS sensor 300 is implemented as an acceleration sensor including a sensing means or unit 314 for detecting a physical quantity depending on a displacement of the mass body 311 is illustrated.

Further, the flexible beam 312 is configured of a beam part 312a and a connection part 312b. The connection part 312b may be formed at one end of the beam part 312a and may be connected to the mass body 311.

Additionally, the connection part 312b includes a central portion 312ba and side portions 312bb' and 312bb".

Further, the connection part 312b may be configured to further include the reinforcing part 112'bc which is formed at the connection part of the flexible beam 112' according to the second exemplary embodiment of the present disclosure (See FIGS. 9 and 10).

Further, the central portion 312ba is formed to extend from the beam part 312a. The side portions 312bb' and 312bb" are configured of a first side portion 312bb' and a second side portion 312bb" which are formed at both sides based on the central portion 312ba.

The first side portion 312bb' and the second side portion 312bb" may be formed to be symmetrical with each other.

Further, the mass body 311 is provided with a connection part 311b corresponding to the connection part 312b of the flexible beam 312. Further, the connection part 311b of the mass body 311 may be formed in a penetration part having the same shape as the connection part 312b of the flexible beam 312.

Detailed technical components and coupling therebetween of the MEMS sensor 300 according to the third exemplary embodiment of the present disclosure are the same as or similar with the MEMS sensor 100 according to the first exemplary embodiment of the present disclosure and therefore the description thereof will be omitted.

Figure 14:
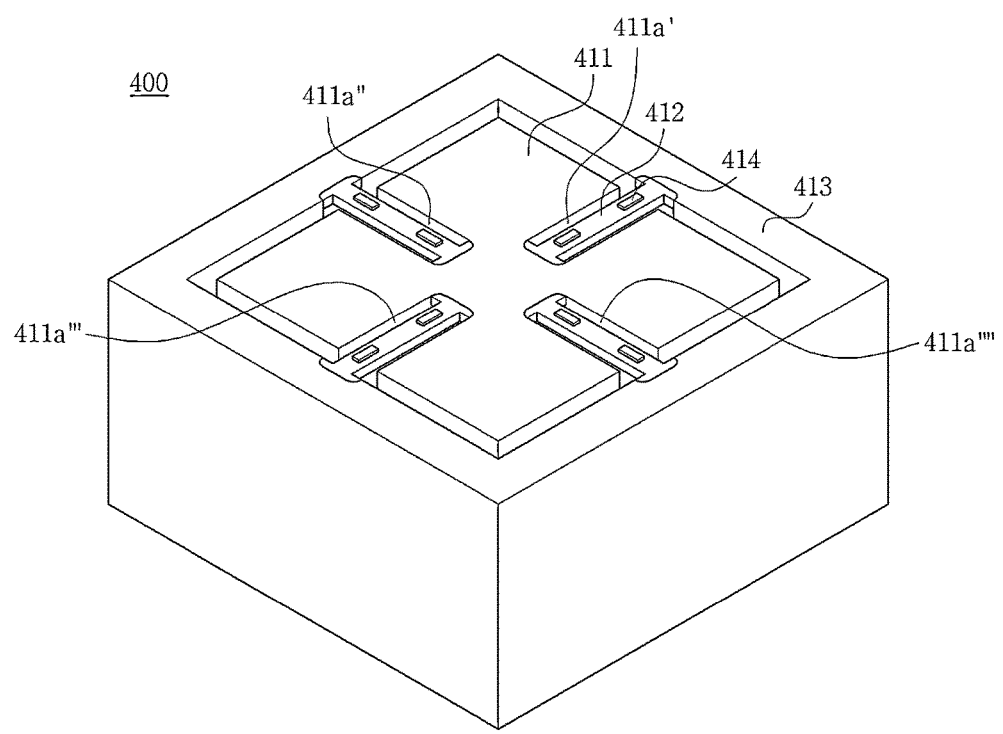
FIG. 14 is a plan perspective view schematically illustrating a MEMS sensor according to a fourth exemplary embodiment of the present disclosure.
Figure 15:
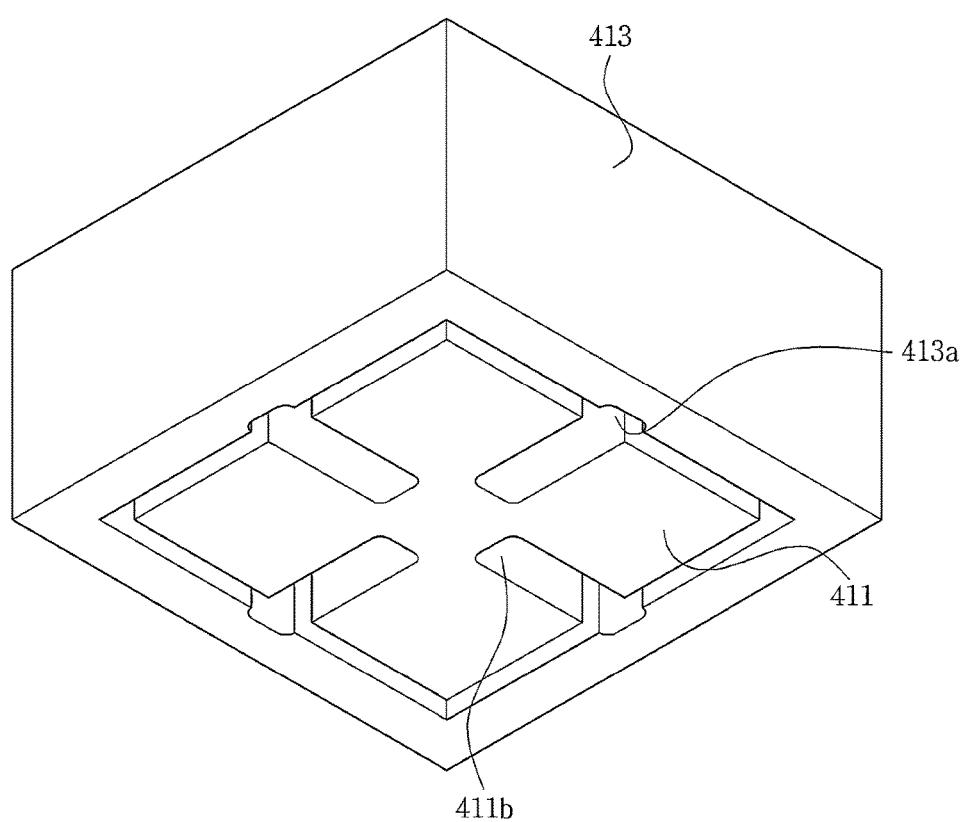
FIG. 15 is a bottom perspective view schematically illustrating the MEMS sensor according to the fourth exemplary embodiment of the present disclosure.

FIG. 14 is a plan perspective view schematically illustrating a MEMS sensor according to a fourth exemplary embodiment of the present disclosure, and FIG. 15 is a bottom perspective view schematically illustrating the MEMS sensor according to the fourth exemplary embodiment of the present disclosure.

The MEMS sensor 400 shown in FIG. 14 is different in a shape of the connection part of the flexible beam and a coupling thereof, as compared with the MEMS sensor 100 according to the first exemplary embodiment illustrated in FIG. 2.

The MEMS sensor 400 may include a mass body 411, a flexible beam 412, and a support part 413. Further, an example in which the MEMS sensor 400 is implemented as an acceleration sensor including a sensing means or unit 414 for detecting a physical quantity depending on a displacement of the mass body 411 is illustrated.

However, the MEMS sensor 400 according to the fourth exemplary embodiment of the present disclosure may be variously implemented as, for example, but not limited to, a pressure sensor, an angular velocity sensor including a driving means, and the like.

The flexible beam 412 may be provided with a sensing means or unit 414 for detecting a physical quantity depending on the displacement of the mass body 411. is the flexible beam 412 may be provided with a connection part which is connected to the mass body 411 and the support part 413, respectively, at least one of the mass body 411 and the support part 413 may be provided with a groove part into which the connection part of the flexible beam 312 is inserted, the groove part may be formed as a penetration part penetrating through the thickness direction of the mass body 411 or the support part 413. The connection part of the flexible beam 411 is inserted into the groove part.

Further, the sensing unit 414 may be disposed at a place at which the flexible beam 411 is maximally deformed.

Figure 16:
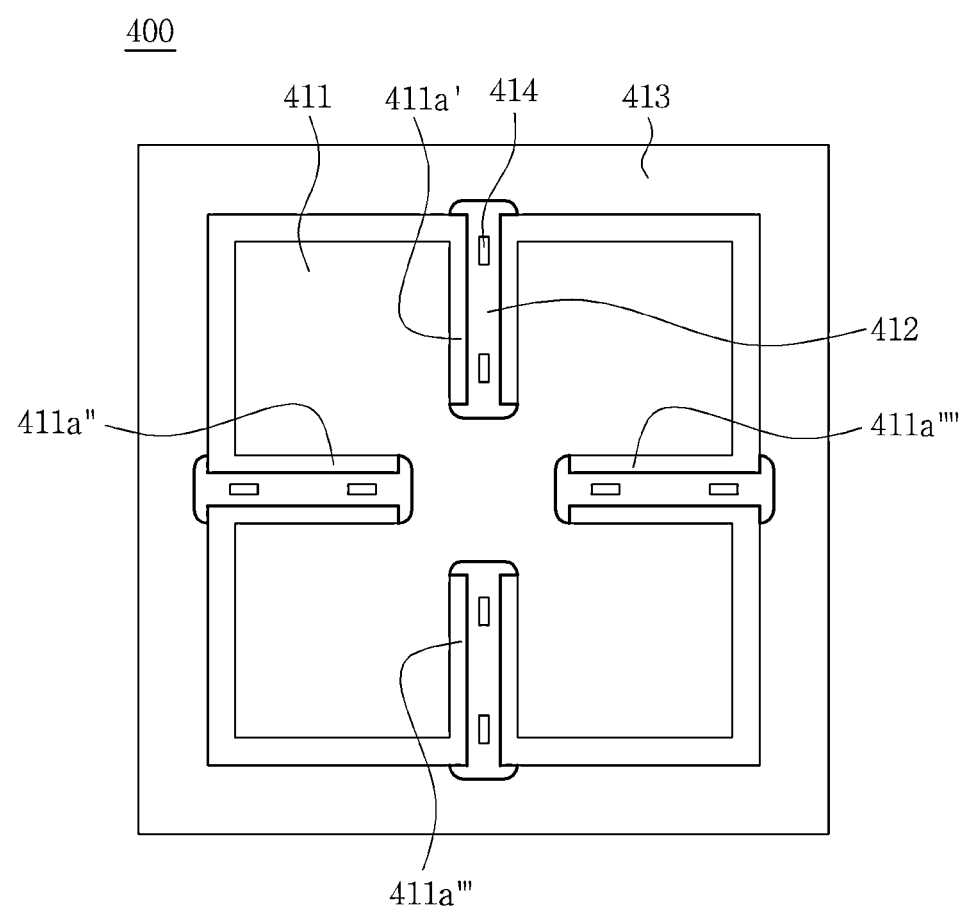
FIG. 16 is a plan view schematically illustrating the MEMS sensor according to the fourth exemplary embodiment of the present disclosure.

FIG. 16 is a plan view schematically illustrating the MEMS sensor according to the fourth exemplary embodiment of the present disclosure. The mass body 411 may be displaceably or moveably coupled with the flexible beam 412 and may be displaced by an inertial force, an external force, a Coriolis force, a driving force and the like.

Further, the mass body 411 may be provided with at least four groove parts 411a', 411a'', 411a''', and 411a'''' at equidistance so that the flexible beams 412 may each be connected to the mass body 411 in oen or more or all directions. The mass body 411 may be generally formed in a rectangular parallelepiped shape.

Each central portion of the mass body 411 may be coupled with each of the four flexible beams 412 in all directions.

Further, the mass body 411 is provided with a groove part 411b corresponding to the connection part 412b of the flexible beam 412 to be described below.

Further, as illustrated in FIG. 15, the groove part 411b may be formed as a penetration part having the same shape as the connection part 412b of the flexible beam 412.

Figure 17A:
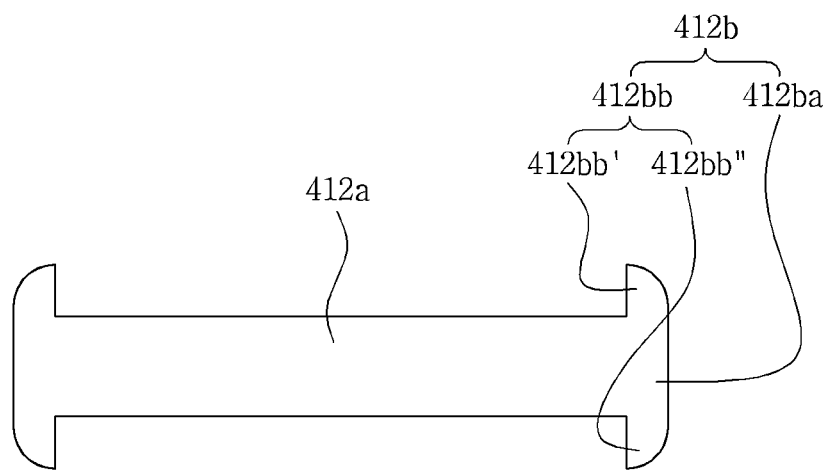
FIG. 17A is a plan view schematically illustrating one exemplary embodiment of a flexible beam included in the MEMS sensor according to the fourth exemplary embodiment of the present disclosure illustrated in FIG. 14.

FIG. 17A is a plan view schematically illustrating one exemplary embodiment of the flexible beam included in the MEMS sensor according to the fourth exemplary embodiment of the present disclosure illustrated in FIG. 14. The flexible beam 412 shown in FIG. A may be formed in a plate shape and may be configured of a flexible substrate, such as a membrane and a beam which have elasticity to allow the mass body 411 to be displaced.

Further, the flexible beam 412 may be configured of a beam part 412a and a connection part 412b. The connection parts 412b may be formed at both ends of the beam part 412a to be symmetrical with each other and be each connected to the mass body 411 or the support part 413.

The connection part 412b of the flexible beam 412 may include a central portion 412ba and a side portion 412bb. For example, the central portion 412ba may be formed to extend from the beam part 412a. The side portion 412bb may be configured of a first side portion 412bb' and a second side portion 412bb'' which are formed at both sides based on the central portion 412ba.

Further, the first side portion 412bb' and the second side portion 412bb'' may be formed to be symmetrical with each other based on the central portion 412ba.

Further, the outside surface of the side portion 412bb of the connection part 412b may be formed in a curve.

Next, as illustrated in FIGS. 14 and 15, the support part 413 is coupled with the flexible beam 412 coupled with the mass body 411 to floatably or movably support the mass body 411. Further, the support part 413 may be provided with the connection part corresponding to the connection part 412b of the flexible beam 412. The connection part of the flexible beam 412 may be formed as the groove part 413a into which the connection part of the flexible beam is inserted.

Further, as illustrated in FIG. 15, the groove part 413a may be formed as the penetration part having the same shape as, or a similar shape with, the connection part 412b of the flexible beam 412.

By the above configuration, as the connection part 412b of the flexible beam 412 is inserted into the groove part 411b of the mass body part 411 and/or the groove part 413a of the support part 413, respectively, the stress concentration of the MEMS sensor 400 according to the fourth exemplary embodiment of the present disclosure may be dispersed to the central portion 412ba and the side portion 412bb, such that the damage inducing stress is reduced.

Figure 17B:
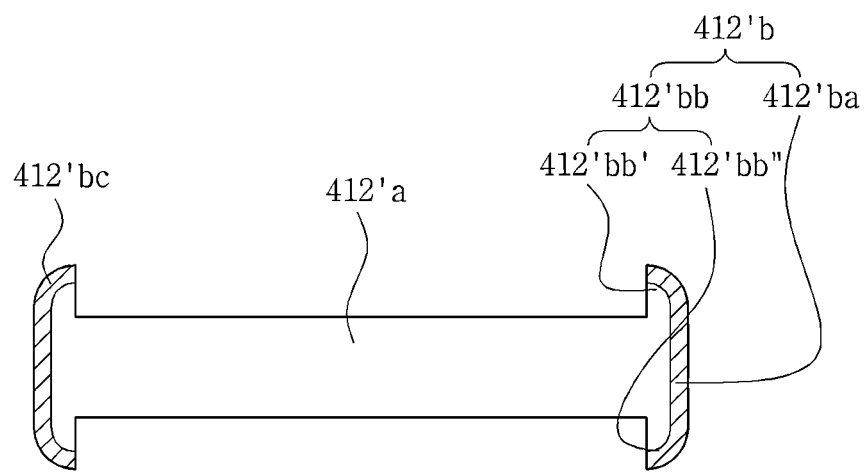
FIG. 17B is a bottom view schematically illustrating another exemplary embodiment of a flexible beam included in the MEMS sensor according to the fourth exemplary embodiment of the present disclosure illustrated in FIG. 14.

FIG. 17B is a plan view schematically illustrating another exemplary embodiment of a flexible beam included in the MEMS sensor according to the fourth exemplary embodiment of the present disclosure illustrated in FIG. 14. A flexible beam 412' shown in FIG. 17B may be further provided with a reinforcing part 412'bc.

The reinforcing part 412'bc may be formed to extend from the end of the connection part 412'b. For instance, the reinforcing part 412'bc is formed at the beam end at which the connection part 412'b is connected to the mass body 411 or the support part 413 to protrude in a thickness direction which is a direction orthogonal to a direction in which the flexible beam 412' is connected to the mass body 411 or the support part 413.

Figure 18:
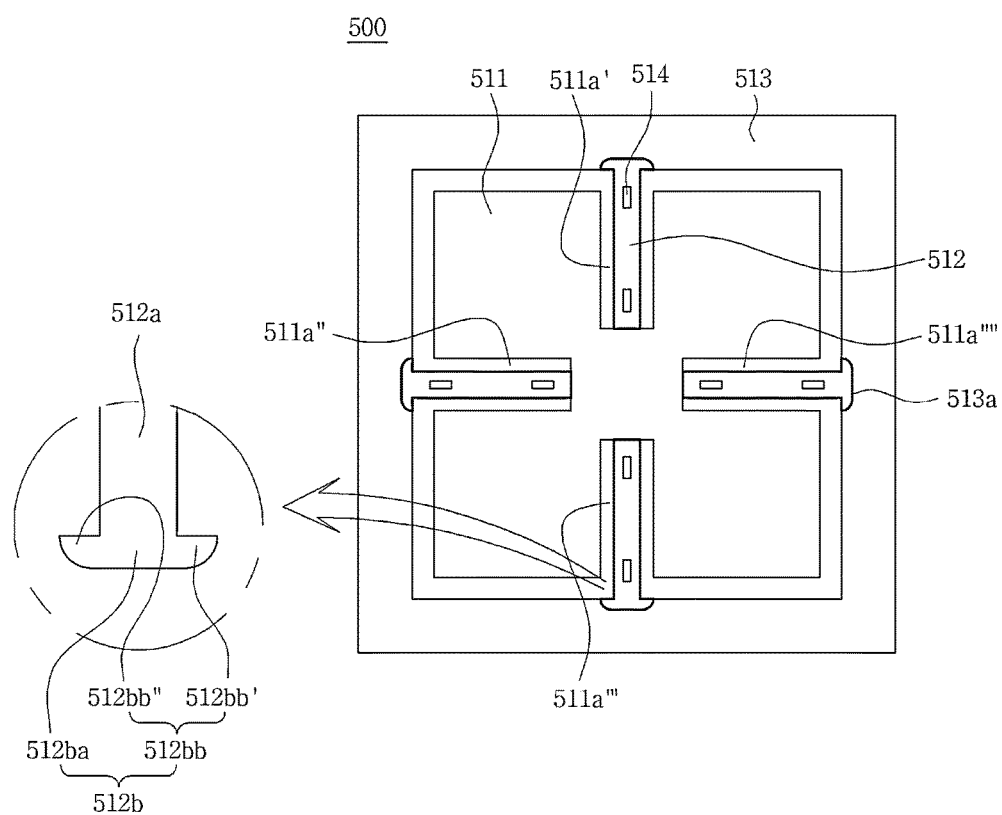
FIG. 18 is a plan view schematically illustrating a MEMS sensor according to a fifth exemplary embodiment of the present disclosure.

FIG. 18 is a plan view schematically illustrating a MEMS sensor according to a fifth exemplary embodiment of the present disclosure. A MEMS sensor 500 shown in FIG. 18 may be different in the formation position of the connection part of the flexible beam, as compared with the MEMS sensor 400 according to the fourth exemplary embodiment illustrated in FIG. 14. For example, the connection part 512b of the flexible beam 512 may be formed to be connected to the support part 513.

The MEMS sensor 500 may include a mass body 511, a flexible beam 512, and a support part 513. An example in which the MEMS sensor 500 is implemented as an acceleration sensor including a sensing means or unit 514 for detecting a physical quantity depending on a displacement of the mass body 511 is illustrated. The flexible beam 512 may be provided with the sensing unit 514 for detecting a physical quantity depending on the displacement of the mass body 511.

Further, the flexible beam 512 may be configured of a beam part 512a and a connection part 512b. The connection part 512b may be formed at one end of the beam part 512a and may be connected to the support part 513.

Additionally, the connection part 512b may include a central portion 512ba and side portion 512bb.

Further, the central portion 512ba may be formed to extend from the beam part 512a. The side portion 512bb may be configured of a first side portion 512bb' and a second side portion 512bb'' which are formed at both sides based on the central portion 512ba. Further, outside surfaces of the first side portion 512bb' and the second side portion 512bb'' may be formed in a curve.

Additionally, the first side portion 512bb' and the second side portion 512bb'' may be formed to be symmetrical with each other.

Next, the support part 513 may be provided with the connection part corresponding to the connection part 512b of the flexible beam 512 The connection part of the support part 513 may be formed as the groove part 513a into which the connection part 512b of the flexible beam 512 is inserted.

In addition, the groove part 513a may be formed as the penetration part having the same shape as, or in a similar shape with, the connection part 512b of the flexible beam 512.

Further, detailed technical components and coupling therebetween of the MEMS sensor 500 according to the fifth exemplary embodiment of the present disclosure are the same as or similar with the MEMS sensor 400 according to the fourth exemplary embodiment of the present disclosure as described above and therefore the description thereof will be omitted.

Figure 19:
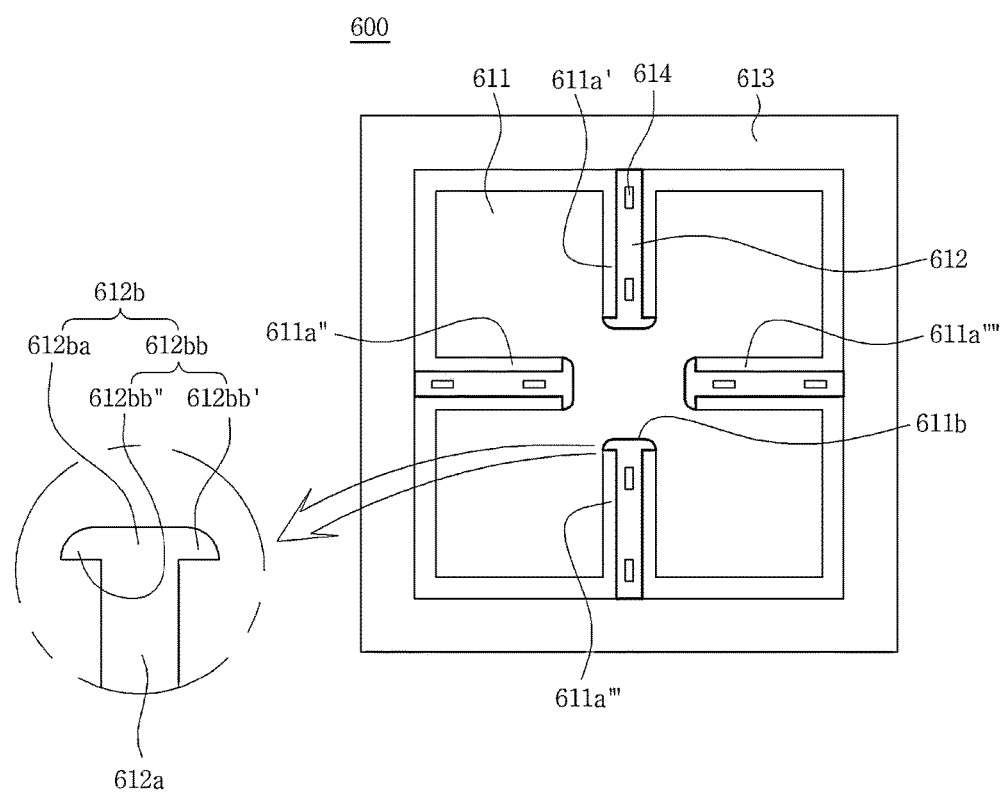
FIG. 19 is a plan view schematically illustrating a MEMS sensor according to a sixth exemplary embodiment of the present disclosure.

FIG. 19 is a plan view schematically illustrating a MEMS sensor according to a sixth exemplary embodiment of the present disclosure. A MEMS sensor 600 shown in FIG. 19 may be different in the formation position of the connection part of the flexible beam, as compared with the MEMS sensor 400 according to the fourth exemplary embodiment illustrated in FIG. 14. For example, the connection part 612b of the flexible beam 612 is formed to be connected to the mass body 611.

The MEMS sensor 600 may include a mass body 611, a flexible beam 612, and a support part 613. An example in which the MEMS sensor 600 is implemented as an acceleration sensor including a sensing means or unit 614 for detecting a physical quantity depending on a displacement of the mass body 611 is illustrated.

The flexible beam 612 may be configured of a beam part 612a and a connection part 612b. The connection part 612b may be formed at one end of the beam part 612a and may be connected to the mass body 611.

Further, the connection part 612b may include a central portion 612ba and a side portion 612bb.

The central portion 612ba may be formed to extend from the beam part 612a. The side portion 612bb may be configured of a first side portion 612bb' and a second side portion 612bb" which are formed at both sides based on the central portion 612ba.

The first side portion 612bb' and the second side portion 612bb" may be formed to be symmetrical with each other.

Further, the mass body 611 may be provided with the connection part corresponding to the connection part 612b of the flexible beam 612. The connection part of the mass body 611 may be formed as the groove part 611b into which the connection part 612b of the flexible beam 512 is inserted.

Additionally, the groove part 611b may be formed as the penetration part having the same shape as or a similar shape with the connection part 612b of the flexible beam 612.

Detailed technical components and coupling therebetween of the MEMS sensor 600 according to the sixth exemplary embodiment of the present disclosure are the same as or similar with the MEMS sensor 400 according to the fourth exemplary embodiment of the present disclosure as described above and therefore the description thereof will be omitted.

Figure 20:
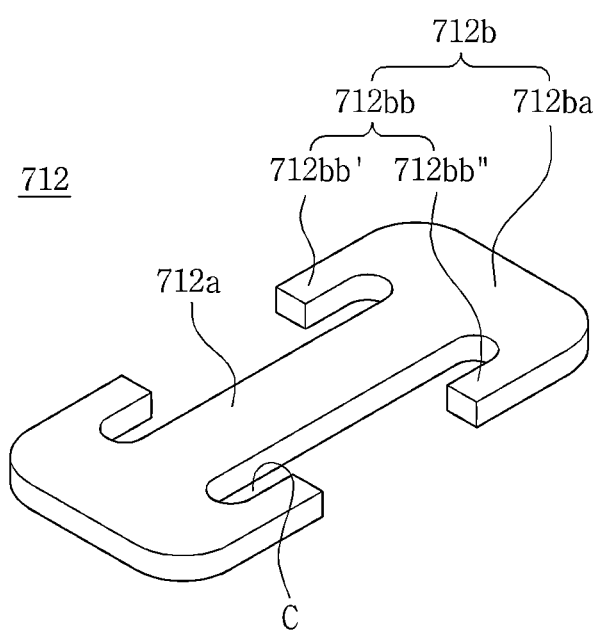
FIG. 20 is a perspective view schematically illustrating a flexible beam according to the third exemplary embodiment of the present disclosure.
Figure 21:
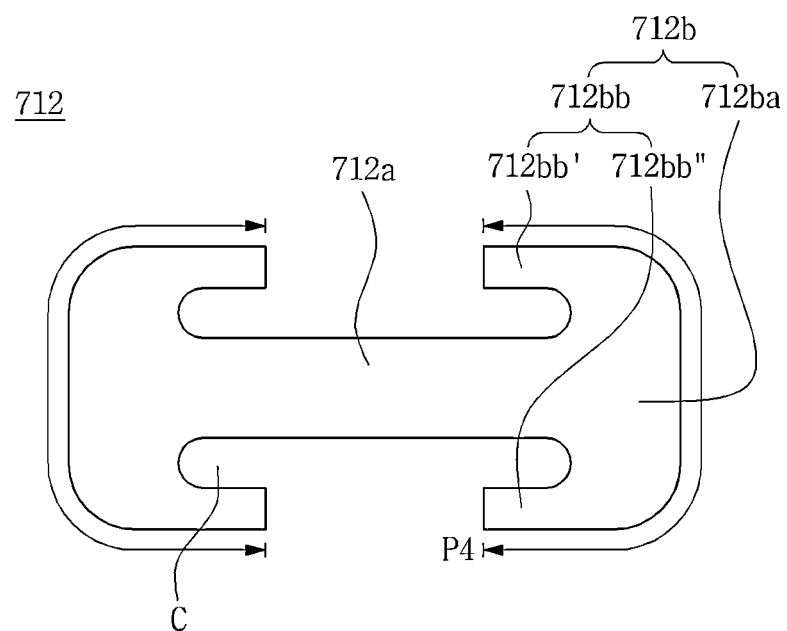
FIG. 21 is a plan view schematically illustrating the flexible beam according to the third exemplary embodiment of the present disclosure.

FIG. 20 is a perspective view schematically illustrating a flexible beam according to the third preferred embodiment of the present disclosure and FIG. 21 is a plan view schematically illustrating the flexible beam according to the third exemplary embodiment of the present disclosure.

A flexible beam 712 shown in FIGS. 20 and 21 is different in a shape of the connection part as compared with the flexible beam 112 according to the first exemplary embodiment of the present disclosure as illustrated in FIG. 7.

The flexible beam 712 may be configured of a beam part 712a and a connection part 712b. The connection parts 712b may be formed at both ends of the beam part 712a to be symmetrical with each other.

Further, the connection part 712b includes a central portion 712ba and a side portion 712bb.

The central portion 712ba may be formed to extend from the beam part 712a. The side portion 712bb may be configured of a first side portion 712bb' and a second side portion 712bb" which are formed at both sides to be symmetrical with each other based on the central portion 712ba.

Further, outside surfaces of the first side portion 712bb' and/or the second side portion 712bb" may be formed in a curve.

Additionally, the first side portion 712bb' and the second side portion 712bb" extend in the opposite direction to the connection direction to the mass body or the support part in the state in which the first side portion 712bb' and the second side portion 712bb" are each connected to both sides of the central portion 712ba. Further, the first side portion 712bb' and the second side portion 712bb" extend in parallel with each other to be spaced apart from the beam part 712a.

That is, the connection part 712b extends so that the side portion 712bb is parallel with the beam part 712a in the state in which the curved portion C is formed.

Further, the connection part 712b is generally formed in a "⌐"-like letter shape in which one side of the connection part 712b connected to the beam part 712a is opened.

By the configuration as described above, an effective width P4 of the flexible beam 712 supporting the load may be maximized. Therefore, the stress concentration may be dispersed to the central portion 712ba and the side portion 712bb and thus the damage inducing stress is reduced.

Figure 22:
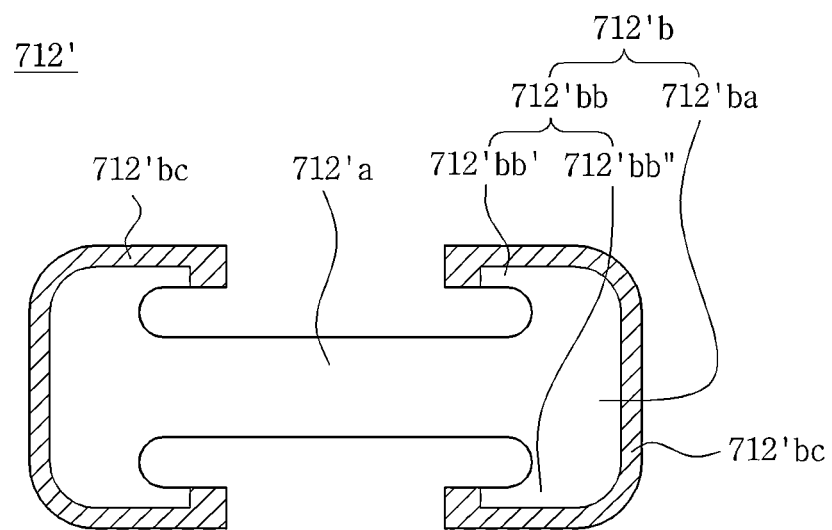
FIG. 22 is a bottom view schematically illustrating a flexible beam according to the fourth exemplary embodiment of the present disclosure.

FIG. 22 is a bottom view schematically illustrating a flexible beam according to the fourth exemplary embodiment of the present disclosure. A flexible beam 712' shown in FIG. 22 may be further provided with the reinforcing part as compared with the flexible beam 712 according to the third exemplary embodiment of the present disclosure as illustrated in FIG. 21.

The flexible beam 712' shown in FIG. 22 may be configured of a beam part 712'a and a connection part 712'b.

The connection part 712'b may include a central portion 712'ba and a side portion 712'bb and may further include a reinforcing part 712'bc.

The side portion 712'bb may be configured of a first side portion 712bb' and a second side portion 712bb".

Next, the reinforcing part 712'bc may be formed to extend from the end of the connection part 712'b. For example, the reinforcing part 712'bc may be formed at the beam end at which the connection part 712'b is connected to the mass body or the support part to protrude in the thickness direction which is the direction orthogonal to the direction in which the flexible beam 712' is connected to the mass body or the support part.

Figure 23:
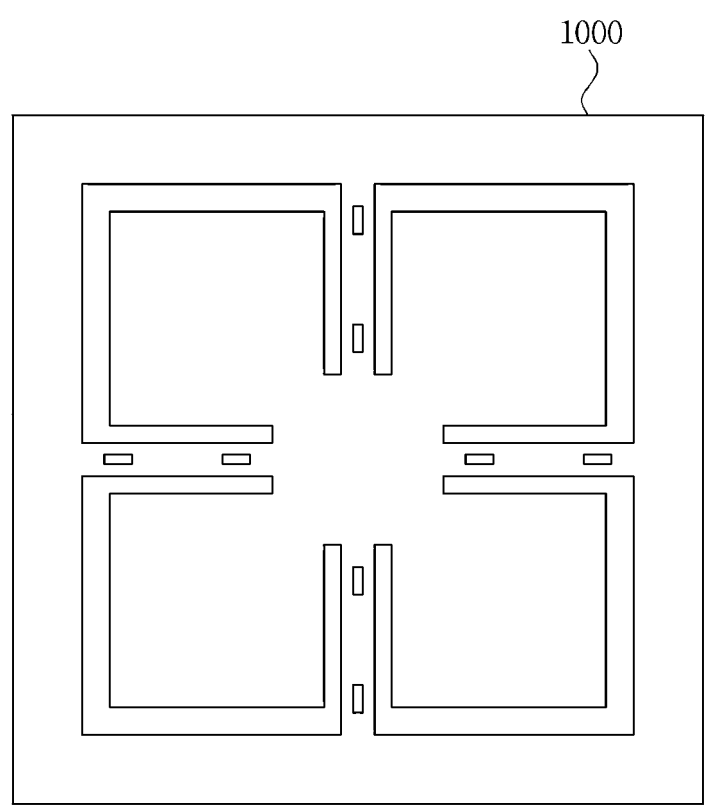
FIG. 23 is a plan view schematically illustrating an upper pattern for manufacturing the MEMS sensor according to the fourth exemplary embodiment of the present disclosure.
Figure 24:
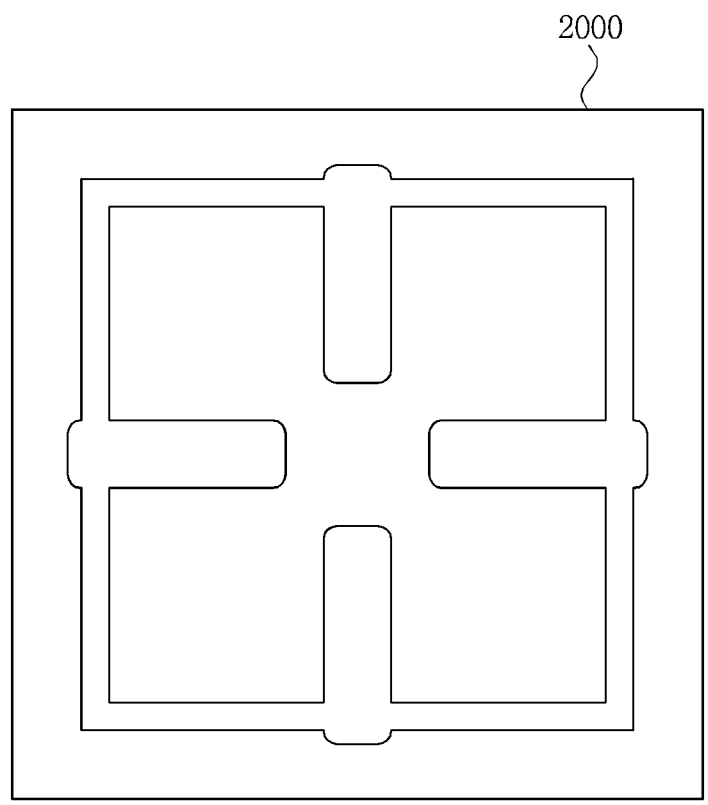
FIG. 24 is a plan view schematically illustrating a lower pattern for manufacturing the MEMS sensor according to the fourth exemplary embodiment of the present disclosure.

FIG. 23 is a plan view schematically illustrating an upper pattern for manufacturing the MEMS sensor according to the fourth exemplary embodiment of the present disclosure, and FIG. 24 is a plan view schematically illustrating a lower pattern for manufacturing the MEMS sensor according to the fourth exemplary embodiment of the present disclosure.

An upper pattern 1000 may be a pattern for forming the mass body, the support part, and the flexible beam of the MEMS sensor. A lower pattern 2000 may be a pattern for forming a through hole and a connection part.

Hereinafter, a method for manufacturing a MEMS sensor using the upper pattern and the lower pattern will be described in more detail with reference to FIGS. 25A to 25D.

FIGS. 25A to 25D are cross-sectional views schematically illustrating a method for manufacturing a MEMS sensor according to an exemplary embodiment of the present disclosure.

Figure 25A:
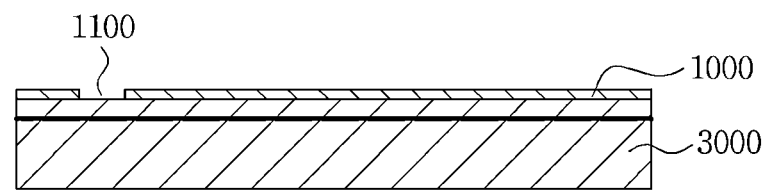
FIGS. 25A to 25D are cross-sectional views schematically illustrating a method for manufacturing a MEMS sensor according to an exemplary embodiment of the present disclosure.

FIG. 25A illustrates forming the upper pattern. For instance, a wafer 3000 is provided with the upper pattern 1000.

Figure 25B:
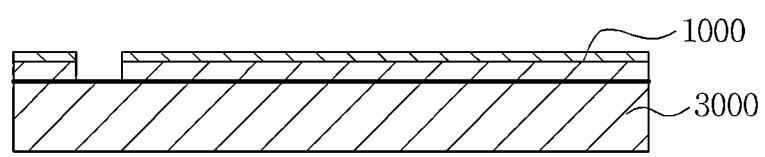

Next, FIG. 25B illustrates etching the upper pattern. As illustrated, the upper portion of the wafer 3000 may be etched through a penetration part 1100 of the upper pattern 1000 illustrated in FIG. 25A to form a flexible beam 3200 of the wafer 3000 as illustrated in FIG. 25B.

Figure 25C:
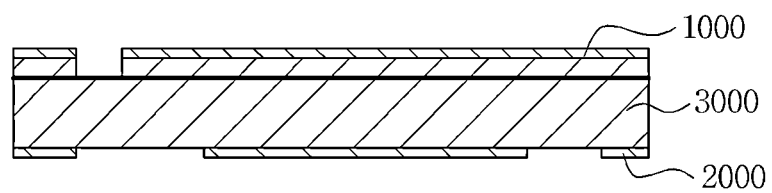
Figure 25D:
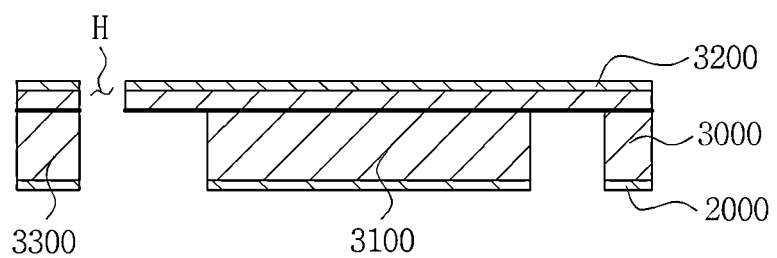

Next, as illustrated in FIG. 25C, a lower portion of the wafer 3000 may be provided with the lower pattern 2000. Further, as illustrated in FIG. 25D, the wafer 3000 may be etched through the lower pattern 2000 to form a hole H and form a weight body 3100, a support part 3300, and the flexible beam 3200.

By the configuration, the connection part of the flexible beam may be simply formed due to the pattern.

As set forth above, according to the exemplary embodiments of the present disclosure, it is possible to reduce the damage inducing stress by dispersing the stress concentration on the connection part of the flexible substrate coupled with the mass body part and the support part, thereby obtaining the MEMS sensor with the secured sensing reliability.

Although the embodiments of the present disclosure have been disclosed for illustrative purposes, it will be appreciated that the present disclosure is not limited thereto, and those skilled in the art will appreciate that various modifications, additions and substitutions are possible, without departing from the scope and spirit of the disclosure.

Accordingly, any and all modifications, variations or equivalent arrangements should be considered to be within the scope of the disclosure, and the detailed scope of the disclosure will be disclosed by the accompanying claims.

What is claimed is:

1. A MEMS sensor, comprising:
    a mass body;
    a support part floatably supporting the mass body; and
    a flexible beam having one end connected to the mass body and another end connected to the support part,
    wherein one of the ends of the flexible beam extends into an intermediate portion of an opening in a connection part having an arcuate contour, and
    wherein the connection part is formed at a terminal end of the flexible beam.

2. The MEMS sensor of claim 1, wherein the connection part is configured to maximize an effective length supporting a load at the flexible beam.

3. The MEMS sensor of claim 1, wherein the flexible beam is provided with a sensing unit detecting a displacement of the mass body.

4. The MEMS sensor of claim 3, wherein the sensing unit is disposed at a place at which the flexible beam is maximally deformed.

5. A MEMS sensor, comprising:
    a mass body;
    a support part floatably supporting the mass body; and
    a flexible beam having one end connected to the mass body and another end connected to the support part,
    wherein one of the ends of the flexible beam is provided with an extending part which protrudes in an opposite direction to a direction connected to the mass body or the support part, and extends into an intermediate portion of an opening in a connection part having an arcuate contour, and
    wherein the connection part is formed at a terminal end of the flexible beam.

6. The MEMS sensor of claim 5, wherein the connection part includes:
    a central portion; and
    a side portion which is connected to one side or both sides of the central portion and comprises the extending part.

7. The MEMS sensor of claim 6, wherein the flexible beam includes a beam part, and the connection part formed at at least one end of the beam part and connected to the mass body or the support part.

8. The MEMS sensor of claim 7, wherein the connection part of the flexible beam is formed at both ends of the beam part to be symmetrical with each other.

9. The MEMS sensor of claim 7, wherein the central portion is formed to extend from the beam part; and
    the side portion comprises a first side portion and a second side portion at the sides of the central portion.

10. The MEMS sensor of claim 9, wherein the first side portion and the second side portion are formed to be symmetrical with each other based on the central portion.

11. The MEMS sensor of claim 9, wherein the first side portion and the second side portion extend to be spaced apart from the beam part, and are each connected to the sides of the central portion.

12. The MEMS sensor of claim 9, wherein the first side portion and the second side portion extend to be parallel with the beam part.

13. The MEMS sensor of claim 6, wherein the connection part extends so that the side portion is spaced apart from a beam part of the flexible beam.

14. The MEMS sensor of claim 6, wherein a distance between an end of a beam part of the flexible beam connected to the central portion and an end of the central portion connected to the mass body or the support part is smaller than a distance between the end of the beam part and a protruding end of the side portion.

15. The MEMS sensor of claim 9, wherein the first side portion and the second side portion of the connection part comprise a curved surface.

16. The MEMS sensor of claim 7, wherein the connection part is formed in a circle or an oval in which one side thereof connected to the beam part is opened.

17. The MEMS sensor of claim 7, wherein the connection part is generally formed in a "C"-like shape in which one side thereof connected to the beam part is opened.

18. The MEMS sensor of claim 9, wherein the connection part is generally formed in a "C"-like shape in which one side thereof connected to the beam part is opened.

19. The MEMS sensor of claim 6, wherein an end of the connection part is provided with a reinforcing part protruding in a direction different from the direction connected to the mass body or the support part.

20. The MEMS sensor of claim 6, wherein an end of the connection part is provided with a reinforcing part protruding in a direction different from the direction connected to the mass body or the support part, and
    the reinforcing part is formed so that the flexible beam is formed to protrude in a direction orthogonal to the direction connected to the mass body or the support part.

21. The MEMS sensor of claim 5, wherein the mass body or the support part is provided with a connection part corresponding to the connection part of the flexible beam.

22. The MEMS sensor of claim 21, wherein the connection part of the mass body comprises a penetration part having a shape corresponding to the connection part of the flexible beam.

23. The MEMS sensor of claim 21, wherein the connection part of the support part comprises a penetration part having a shape corresponding to the connection part of the flexible beam and a support end covering the connection part of the flexible beam coupled with the penetration part.

24. A MEMS sensor, comprising:
    a mass body;
    a support part floatably supporting the mass body; and
    a flexible beam having one end connected to the mass body and another end connected to the support part,
    wherein one of the ends of the flexible beam extends into an intermediate portion of an opening in a connection part having an arcuate contour so that a length of a surface at which the flexible beam contacts the mass body or the support part is increased, and
    wherein the connection part is formed at a terminal end of the flexible beam.

25. The MEMS sensor of claim 24, wherein the connection part of the fixable beam is configured to disperse stress at the end of the flexible beam.

26. The MEMS sensor of claim 24, wherein the end of the flexible beam is formed to have a curvature which is gradually increased and then reduced from a central portion toward one end or both ends.

27. The MEMS sensor of claim 24, wherein the connection part is formed to protrude in an opposite direction to a direction connected to the mass body or the support part.

28. The MEMS sensor of claim 24, wherein the connection part is formed in a circle, a semi-circle, or an oval.

29. The MEMS sensor of claim 24, wherein the connection part is spaced apart from a portion of the flexible beam having a beam shape at a predetermined interval and is protrudedly formed.

30. The MEMS sensor of claim 24, wherein a sensing unit is formed at a place at which the flexible beam is maximally deformed.

31. A MEMS sensor, comprising:
a mass body;
a support part floatably supporting the mass body; and
a flexible beam having one end connected to the mass body and another end connected to the support part,
wherein one of the ends of the flexible beam is provided with an extending part configured to increase a contact area with the mass body or the support part, and extends into an intermediate portion of an opening in a connection part having an arcuate contour, and
wherein the connection part if formed at a terminal end of the flexible beam.

32. The MEMS sensor of claim 31, wherein the connection part is connected to the mass body or the support part, and
at least one of the mass body and the support part is provided with a groove part corresponding to the connection part of the flexible beam, the groove part is formed as a penetration part penetrating through the mass body or the support part, and the connection part of the flexible beam is inserted into the groove part.

33. The MEMS sensor of claim 32, wherein the flexible beam includes a beam part, and the connection part formed at an end of the beam part.

34. The MEMS sensor of claim 33, wherein the connection part of the flexible beam includes:
a central portion formed to extend from the beam part; and
a side portion comprising a first side portion and a second side portion at sides of the central portion.

35. The MEMS sensor of claim 34, wherein the first side portion and the second side portion are formed to be symmetrical with each other based on the central portion.

36. The MEMS sensor of claim 34, wherein the first side portion and the second side portion of the connection part comprise a curved surface.

37. The MEMS sensor of claim 32, wherein an end of the connection part is provided with a reinforcing part protruding in a direction different from a direction connected to the mass body or the support part.

38. The MEMS sensor of claim 34, wherein an end of the connection part is provided with a reinforcing part
formed so that the flexible beam is formed to protrude in a direction orthogonal to a direction connected to the mass body or the support part.

39. The MEMS sensor of claim 31, wherein the flexible beam is provided with a sensing unit detecting a displacement of the mass body.

40. The MEMS sensor of claim 39, wherein the sensing unit is disposed at a place at which the flexible beam is maximally deformed.

41. A MEMS sensor comprising:
a mass body;
a support part configured to movably support the mass body; and
a flexible beam coupling between the mass body and the support part, and extending into an intermediate portion of an opening in one or more connection parts having an arcuate contour,
wherein the connection parts are coupled to the mass body and/or the support part, and
wherein the one or more connection parts are formed at terminal ends of the flexible beam.

42. The MEMS sensor of claim 41, wherein at least one end of the connection parts of the flexible beam is formed to be bent in an opposite direction.

43. The MEMS sensor of claim 41, wherein the mass body or the support part comprises a groove part in which the connection part of the flexible beam is inserted.

44. The MEMS sensor of claim 41, wherein the connection part of the flexible beam is configured to disperse stress applied to the flexible beam.

* * * * *